United States Patent [19]

Flatley et al.

[11] Patent Number: 4,722,912

[45] Date of Patent: Feb. 2, 1988

[54] METHOD OF FORMING A SEMICONDUCTOR STRUCTURE

[75] Inventors: Doris W. Flatley, Somerset County, Hillsboro Township; Alfred C. Ipri, Mercer County, Hopewell Township, both of N.J.

[73] Assignee: RCA Corporation, Princeton, N.J.

[21] Appl. No.: 856,277

[22] Filed: Apr. 28, 1986

[51] Int. Cl.[4] .............................................. H01L 27/08
[52] U.S. Cl. .................................... 437/180; 437/190; 437/193; 437/913; 437/983; 427/255.3; 357/49; 156/643
[58] Field of Search ................ 29/571, 576 W, 576 E, 29/576 T; 156/643; 148/150; 427/255.3; 357/49

[56] References Cited

U.S. PATENT DOCUMENTS

| 3,571,702 | 5/1970 | Jackson, Jr. et al. | 117/212 |
|---|---|---|---|
| 3,740,280 | 6/1973 | Ronen | 156/11 |
| 3,890,632 | 6/1975 | Ham et al. | 357/23 |
| 3,943,542 | 3/1976 | Ho et al. | 357/23 |
| 3,974,515 | 8/1976 | Ipri et al. | 357/23 |
| 4,002,501 | 1/1977 | Tamura | 148/1.5 |
| 4,016,016 | 4/1977 | Ipri | 148/175 |
| 4,076,573 | 2/1978 | Shaw et al. | 156/613 |
| 4,160,260 | 7/1979 | Weitzel et al. | 357/23 |
| 4,174,217 | 11/1979 | Flatley | 96/36.2 |
| 4,178,191 | 12/1979 | Flatley | 148/1.5 |
| 4,183,134 | 1/1980 | Oehler et al. | 29/571 |
| 4,199,384 | 4/1980 | Hsu | 148/174 |
| 4,199,773 | 4/1980 | Goodman et al. | 357/23 |
| 4,242,156 | 12/1980 | Peel | 148/175 |
| 4,252,582 | 2/1981 | Anantha et al. | 148/175 |
| 4,263,709 | 4/1981 | Weitzel et al. | 29/571 |
| 4,277,884 | 7/1981 | Hsu | 29/571 |
| 4,313,809 | 2/1982 | Benyon | 204/192 |
| 4,323,910 | 4/1982 | Sokoloski et al. | 357/23 |
| 4,341,569 | 7/1982 | Yaron et al. | 148/1.5 |
| 4,356,623 | 11/1983 | Hunter | 29/571 |
| 4,368,085 | 1/1983 | Peel | 148/33.3 |
| 4,385,937 | 5/1983 | Ohmura | 148/1.5 |
| 4,393,572 | 7/1983 | Policastro et al. | 29/571 |
| 4,393,578 | 7/1983 | Cady et al. | 29/576 |
| 4,395,726 | 7/1983 | Maeguchi | 357/41 |
| 4,447,823 | 5/1984 | Maeguchi et al. | 357/23 |
| 4,455,738 | 6/1984 | Houston et al. | 29/571 |
| 4,472,459 | 9/1984 | Fisher | 427/93 |
| 4,491,856 | 1/1985 | Egawa et al. | 357/4 |
| 4,523,963 | 6/1985 | Ohta et al. | 148/1.5 |
| 4,533,934 | 8/1985 | Smith | 357/23.7 |
| 4,547,231 | 10/1985 | Hine | 148/175 |
| 4,557,794 | 12/1985 | McGinn et al. | 156/612 |
| 4,604,304 | 8/1986 | Faraone et al. | 427/255 |
| 4,658,495 | 4/1987 | Flatley et al. | 29/576 W |

FOREIGN PATENT DOCUMENTS 0179719  4/1986  European Pat. Off. .
133667   8/1982  Japan .

OTHER PUBLICATIONS

"Selective Reactive Ion Etching of Silican Dioxide", Solid State Technology, Apr. 1984, J. S. Chang, pp. 214–219.

(List continued on next page.)

Primary Examiner—Brian E. Hearn
Assistant Examiner—Beverly Ann Pawlikowski
Attorney, Agent, or Firm—R. Hain Swope; Allen LeRoy Limberg

[57] ABSTRACT

A method for forming a layer of silicon dioxide over a silicon island on an insulating surface wherein the layer on top of the island is thinner than on the sidewalls is disclosed. The silicon island is oxidized and a silicon layer is deposited thereover. The layer of silicon is oxidized and the oxide layer is anisotropically etched until the top surface of the island is exposed, leaving oxide only on the sidewalls of the island. The exposed portion of the island is then oxidized to form a thin layer of gate oxide thereon. A conductive polycrystalline silicon electrode is deposited on the oxide-covered island. The disclosed method is particularly useful in the formation of MOSFETs.

11 Claims, 6 Drawing Figures

OTHER PUBLICATIONS

Ansell et al., "CMOS in Radiation Environments," *VLSI Systems,* Sep. 1986, pp. 28–36.

Hughes et al., "Oxide Thickness Dependence of High--Energy-Electron-, VUV-, and Corona-Induced Charge in MOS Capacitors" *Applied Physics Letters,* vol. 29, No. 6, Sep. 15, 1976, pp. 377–379.

Naruke et al., "Radiation-Induced Interface States of Poly-Si Gate MOS Capacitors Using Low Temperature Gate Oxidation," IEEE Transactions on Nuclear Science, vol. NS-30, No. 6, Dec. 1983, pp. 4054–4058.

Saks et al., "Radiation Effects in MOS Capacitors with Very Thin Oxides at 80° K," IEEE Transactions on Nuclear Science, vol. NS-31, No. 6, Dec. 1984, pp. 1249–1255.

K. Tanno et al., "Selective Silicon Epitaxy Using Reduced Pressure Technique," Japanese Journal of Applied Physics, vol. 21, No. 9, Sep. 1982, pp. L564–L566.

W. E. Ham, "The Study of Microcircuits by Transmission Electron Microscopy", RCA Review, vol. 38, Sep. 1977, pp. 351–389.

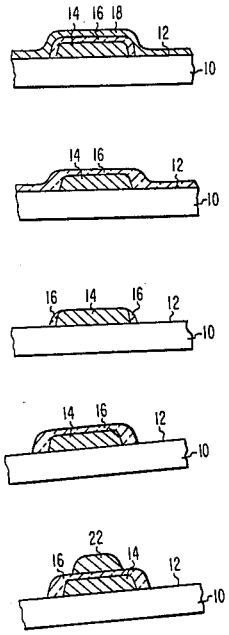

METHOD OF FORMING A SEMICONDUCTOR STRUCTURE

This invention pertains to a method for forming the gate dielectric of a silicon transistor on an insulating substrate. The present method is particularly applicable to the formation of a metal oxide semiconductor field effect transistor (MOSFET) on an insulating substrate.

BACKGROUND OF THE INVENTION

A silicon-on-insulator (SOI) integrated circuit typically includes a plurality of spaced, isolated islands of single-crystalline silicon on the surface of an insulator, e.g. a sapphire, substrate. Each island generally includes a MOSFET which has source and drain regions spaced by a channel region, a channel oxide layer over at least the channel region and a conductive gate on the oxide layer and over the channel region. The various MOSFETs are electrically connected to form a desired circuit, such as a complementary MOS (CMOS) integrated circuit. The MOSFETs are typically electrically connected, at least in part, by conductive interconnects of doped polycrystalline silicon which extend over the surface of the substrate between the various silicon islands.

The insulating material of the substrate for the fabrication of MOSFETs may be monocrystalline, e.g. sapphire, beryllia or spinel, or may be amorphous, e.g. quartz (glass). When the substrate insulating material is monocrystalline, the devices are generally referred to as SOS (silicon-on-sapphire) devices. Devices having an amorphous insulating substrate are generally referred to as poly-on-glass. These designations will be utilized herein.

In the fabrication of poly-on-glass or SOS devices, following the formation of one or more silicon islands on the substrate surface, a gate oxide is formed so as to selectively overlie a portion or portions of the silicon island(s). A conductive gate electrode, typically of doped polycrystalline silicon, is then formed over the gate oxide so as to be capacitively coupled to a portion of the underlying silicon island. A high quality device requires a high quality silicon dioxide dielectric. Such a dielectric is provided in copending U.S. patent application Ser. No. 793,312, METHOD OF FORMING AN IMPROVED GATE DIELECTRIC FOR A MOSFET ON AN INSULATING SUBSTRATE, A.C. Ipri, filed Oct. 31, 1985. While this method produces a superior gate dielectric, it is limited in that the oxide on the sidewalls of the silicon islands is of approximately the same thickness as that on the top of the islands. Ideally, the gate dielectric layer on the top of the islands should be relatively thin and that on the sides substantially thicker to protect the device and prevent breakdown. A method of forming such a structure is provided in accordance with this invention.

SUMMARY OF THE INVENTION

A method of forming a silicon dioxide layer on a silicon island on an insulating substrate wherein said layer is substantially thinner on the top of the island than on the sidewalls thereof is disclosed. There is provided an insulating substrate having disposed thereon one or more silicon islands. A thin layer of silicon dioxide is formed on the islands. A layer of silicon is deposited over the islands and the substrate adjacent thereto. The layer of silicon is oxidized to form a thick layer of silicon dioxide. The silicon dioxide layer is anisotropically etched until the top surface of the islands is exposed. This etching step likewise exposes the surface of the substrate, leaving silicon dioxide only on the sidewall surfaces of the islands. The islands are oxidized to form a layer of silicon dioxide thereover which is substantially thinner on the top surface than on the sidewalls. A layer of conductive polycrystalline silicon is deposited over the structure to overlie at least a portion of the top surface of the islands.

DETAILED DESCRIPTION OF THE PREFERRED EMBODIMENTS

Figure 1:
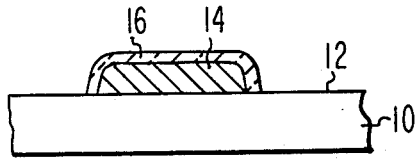
FIGS. 1-6 are sectional views illustrating in sequence the various steps of the present invention.

In FIG. 1, a silicon island 14 has been formed on a major surface 12 of a substrate 10. The substrate 10 is of an insulating material which may be monocrystalline, such as sapphire, beryllia or spinel, or amorphous, such as glass. The silicon island 14 is typically polycrystalline when the substrate 10 is amorphous and monocrystalline, although it may be polycrystalline, when substrate 10 is monocrystalline. The silicon island 14 is formed by depositing a layer of silicon over the substrate 10 and lithographically defining it utilizing conventional techniques to form the island 14. The silicon island 14 is suitably from about 100 to 700 nm thick. The silicon island is then oxidized, suitably by thermal oxidation to produce a layer of silicon dioxide 16 on all exposed surfaces thereof. The layer of silicon dioxide 16 is suitably from about 10 to 40 nm, preferably from about 20 to 30 nm, thick.

Figure 2:
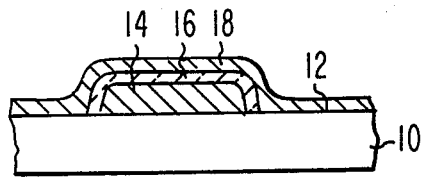

A layer of silicon 18 is then conventionally deposited over the island and the substrate adjacent thereto as shown in FIG. 2. The silicon layer 18 is suitably deposited in the amorphous state, although it may be polycrystalline or substantially monocrystalline if so desired. The silicon layer 18 is suitably deposited in the amorphous state from silane by low pressure chemical vapor deposition (LPCVD) at a temperature between about 560° and 580° C. to a thickness of between about 10 and 40 nm, suitably from about 20 to 30 nm.

Figure 3:
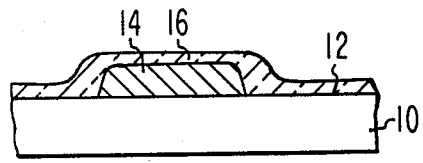
Figure 4:
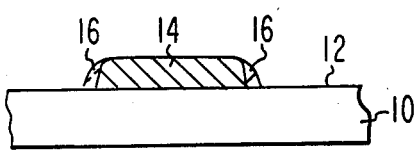
Figure 5:
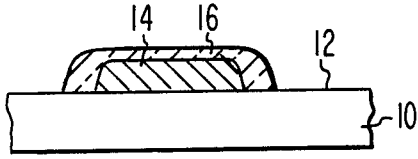

The layer of silicon 18 is oxidized to form a thick layer of silicon dioxide 16 as shown in FIG. 3. The silicon dioxide 16 is anisotropically etched for a time sufficient to expose the top of the island 14. Since the silicon dioxide layer 16 is about the same thickness on top of the island 14 as on the substrate surface 12, the etching step will also expose the substrate surface, leaving only the oxide at the sidewalls of the island 14 as shown in FIG. 4. The exposed surface of the island 14 is oxidized to grow the desired thickness of gate oxide as shown in FIG. 5.

Figure 6:
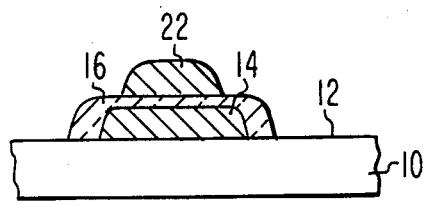

MOSFETs can be formed on the islands 14 using any standard technique. For example, a layer of conductive polycrystalline silicon is deposited over the structure. The thin silicon dioxide layer 16 overlying the island 14 will form the channel dielectric of the device. The polycrystalline silicon layer may be made conductive by doping with an impurity such as phosphorus, suitably by adding a source of the impurity, e.g. phosphine, to the silane utilized to form the layer by LPCVD. The conductive polycrystalline silicon electrode is then conventionally, e.g. lithographically, defined to form strips 22 extending across portions of the islands 14 which are to be the channel regions of the MOSFETs as shown in FIG. 6. The strips of doped, conductive polycrystalline silicon 22, which serve as the gates of the MOSFETs, will extend over the silicon dioxide layer 16 from one island 14 to another to provide the desired connection between devices Using the gate-forming strips of polycrystalline silicon 22 as a mask, ions of an appropriate conductivity type material are then implanted into the islands 14 on opposite sides of the gate strips 22 to form the source and drain regions of the MOSFETs. Additional strips of conductive material may then be formed on the device with the strips making ohmic contact with the source and drain regions formed in the islands 14 and extending over the silicon dioxide layers 16 to electrically connect the various MOSFETs in a desired circuit arrangement.

The method of this invention is advantageous in that it provides isolated islands on an insulator substrate having a thick protective oxide on the sidewalls where it is necessary to prevent or at least minimize the flow of electrons from the substrate to the polycrystalline silicon conductive lines. This is particularly important when the substrate is sapphire. The subject method at the same time provides a means for controlling the thickness of the gate oxide layer formed on top of the isolated islands so that a thin layer of oxide can be formed which is advantageous to the performance of a device such as a MOSFET formed in the islands and the circuit formed therefrom.

The invention has been described with reference to preferred embodiments thereof. It will be appreciated by those skilled in the art that various modifications may be made from the specific details given without departing from the spirit and scope of the invention.

We claim:

1. A method of forming a silicon dioxide layer on silicon islands on an insulating substrate comprising:
   (a) providing an insulating substrate having at least one silicon island disposed on a major surface thereof;
   (b) oxidizing the surface of the silicon island to form a layer of silicon dioxide thereover;
   (c) depositing a layer of silicon on the oxidized island and the substrate adjacent thereto;
   (d) oxidizing the silicon to form silicon dioxide;
   (e) anisotropically etching the silicon dioxide layer for a time sufficient to expose the top surface of the island, but insufficient to completely remove the silicon dioxide on the sidewalls of the island; and
   (f) oxidizing the exposed portion of the island for a time sufficient to form a layer of silicon dioxide of predetermined thickness thereon substantially thinner than the thickness of said silicon dioxide on the sidewalls of said island.

2. A method in accordance with claim 1, wherein the insulating substrate is an amorphous material.

3. A method in accordance with claim 2, wherein the amorphous material is glass.

4. A method in accordance with claim 2, wherein the silicon island is polycrystalline.

5. A method in accordance with claim 2, wherein the silicon island is monocrystalline.

6. A method in accordance with claim 1, wherein the insulating substrate is a crystalline material.

7. A method in accordance with claim 6, wherein the crystalline material is selected from the group consisting of sapphire, spinel and beryllia.

8. A method in accordance with claim 7, wherein the crystalline material is sapphire.

9. A method in accordance with claim 7, wherein the silicon island is monocrystalline.

10. A method in accordance with claim 1, wherein the silicon layer is deposited over the oxidized island in the amorphous state.

11. A process in accordance with claim 1, additionally including the step depositing a conductive polycrystalline silicon electrode on said layer of silicon dioxide of predetermined thickness.

* * * * *